(12) United States Patent
Renger et al.

(10) Patent No.: US 9,270,206 B2
(45) Date of Patent: Feb. 23, 2016

(54) METHODS AND SYSTEMS FOR APPLYING CHARGE TO A PIEZOELECTRIC ELEMENT

(71) Applicant: ALFRED E. MANN FOUNDATION, Valencia, CA (US)

(72) Inventors: Herman Lee Renger, Calabasas, CA (US); Sam William Bowman, IV, Valencia, CA (US)

(73) Assignee: ALFRED E. MANN FOUNDATION FOR SCIENTIFIC RESEARCH, Santa Clara, CA (US)

(*) Notice: Subject to any disclaimer, the term of this patent is extended or adjusted under 35 U.S.C. 154(b) by 135 days.

(21) Appl. No.: 13/748,569

(22) Filed: Jan. 23, 2013

(65) Prior Publication Data
US 2013/0266460 A1    Oct. 10, 2013

Related U.S. Application Data

(60) Provisional application No. 61/589,736, filed on Jan. 23, 2012.

(51) Int. Cl.
| | |
|---|---|
| H01L 41/04 | (2006.01) |
| H02N 2/06 | (2006.01) |
| F04B 43/04 | (2006.01) |
| F04B 39/00 | (2006.01) |
| F04B 43/09 | (2006.01) |

(52) U.S. Cl.
CPC .............. *H02N 2/06* (2013.01); *F04B 39/0061* (2013.01); *F04B 43/046* (2013.01); *F04B 43/095* (2013.01); *H01L 41/042* (2013.01)

(58) Field of Classification Search
CPC ................................. H01L 41/042; H02N 2/06
USPC ....................... 310/316.03, 317, 339; 318/116
See application file for complete search history.

(56) References Cited

U.S. PATENT DOCUMENTS

| | | | |
|---|---|---|---|
| 4,186,437 A | 1/1980 | Cuk | |
| 6,674,654 B2 | 1/2004 | Winick et al. | |
| 7,287,965 B2 | 10/2007 | Vogeley et al. | |
| 7,719,252 B2 | 5/2010 | Takada et al. | |
| 7,786,709 B2 | 8/2010 | Lawson et al. | |
| 2001/0035697 A1* | 11/2001 | Rueger et al. | 310/316.03 |
| 2007/0296307 A1* | 12/2007 | Fukagawa et al. | 310/316.03 |

\* cited by examiner

*Primary Examiner* — Derek Rosenau

(74) *Attorney, Agent, or Firm* — Henricks, Slavin & Holmes LLP

(57) ABSTRACT

Methods and systems for applying charge to a piezoelectric element include and/or facilitate implementation of processes including cyclical multi-stage processes for: providing a piezoelectric element with an accumulated charge; providing one or more charge holding elements with a scavenged charge from the piezoelectric element; substantially removing or discharging a remaining charge from the piezoelectric element; and applying the scavenged charge to the piezoelectric element with an opposite polarity in relation to the polarity of the remaining charge.

19 Claims, 8 Drawing Sheets

PRE / POST FIRE

METHODS AND SYSTEMS FOR APPLYING CHARGE TO A PIEZOELECTRIC ELEMENT

CROSS-REFERENCE TO RELATED APPLICATIONS

This application claims the benefit of U.S. Provisional Application No. 61/589,736, filed on Jan. 23, 2012, which is hereby incorporated by reference.

TECHNICAL FIELD

The present invention relates generally to piezoelectric devices and, in particular, methods and systems for applying charge to and recovering charge from a piezoelectric element or device.

BACKGROUND ART

A piezoelectric element is a crystalline material which produces an electric voltage when subjected to mechanical pressure. In view of their various properties, piezoelectric elements have been used as actuators in diaphragm displacement pumps. In general, piezoelectric actuators of the type used in pumps require excitation by a regularly reversing high-voltage field. Depending on the application, the excitation voltage may be anywhere from 25 to 1000 volts or more and the frequency of field reversal may be anywhere from a fraction of a cycle per second to thousands of cycles per second. Typically, this excitation signal must be derived from a relatively low-voltage source of 1.5-25 volts. See e.g., U.S. Pat. No. 7,287,965 B2, which is hereby incorporated by reference.

It would be useful to be able to provide methods and systems for applying charge to piezoelectric elements/devices that are more energy efficient. It would be useful to be able to improve energy utilization by a piezoelectric pump or device.

SUMMARY OF THE INVENTION

In an example embodiment, a method for applying charge to a piezoelectric element includes: imparting a scavenged charge to one or more charge holding elements, said scavenged charge being at least a portion of an accumulated charge associated with a piezoelectric element; and coupling a voltage source or reference and the one or more charge holding elements to the piezoelectric element such that a remaining charge on the piezoelectric element is removed and the scavenged charge is applied to the piezoelectric element with an opposite polarity in relation to the polarity of the remaining charge.

In an example embodiment, a method for applying charge to a piezoelectric element includes: providing a piezoelectric element with an accumulated charge; providing one or more charge holding elements with a scavenged charge from the piezoelectric element; substantially removing or discharging a remaining charge from the piezoelectric element; and applying the scavenged charge to the piezoelectric element with an opposite polarity in relation to the polarity of the remaining charge.

In an example embodiment, a system including electronics for producing a drive signal for a device having a piezoelectric transducer includes: a controller configured to generate voltage pulses; and converter circuitry including one or more charge holding elements, the converter circuitry being configured to use the voltage pulses to develop an accumulated charge associated with the piezoelectric transducer, provide the one or more charge holding elements with a scavenged charge from the piezoelectric transducer, substantially remove or discharge a remaining charge from the piezoelectric transducer, and apply the scavenged charge to the piezoelectric transducer with an opposite polarity in relation to the polarity of the remaining charge.

In an example embodiment, a pump includes: a pump body configured to at least partially define a pumping chamber; a piezoelectric element responsive to a drive signal for pumping fluid in the pumping chamber; and a pump driver configured to provide the drive signal, the pump driver including a flyback boost circuit configured to develop an accumulated charge associated with the piezoelectric element and also a charge on one or more charge holding elements, a charge scavenging circuit configured to provide a charge scavenged from the piezoelectric element to the one or more charge holding elements, a charge removing circuit configured to substantially remove or discharge a remaining charge from the piezoelectric element, and a charge reclaiming circuit configured to apply the scavenged charge to the piezoelectric element with an opposite polarity in relation to the polarity of the remaining charge.

DISCLOSURE OF INVENTION

The methodologies and technologies described herein generally involve applying charge to a piezoelectric element and can include (and/or facilitate implementation of processes including cyclical multi-stage processes for) one or more of, for example: providing a piezoelectric element with an accumulated charge; providing one or more charge holding elements with a scavenged charge from the piezoelectric element; substantially removing or discharging a remaining charge from the piezoelectric element; and applying the scavenged charge to the piezoelectric element with an opposite polarity in relation to the polarity of the remaining charge.

Figure 1:
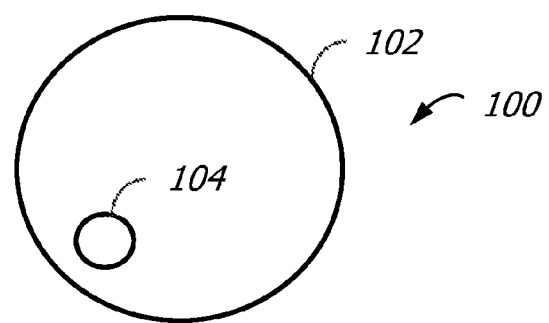
FIG. 1 is an illustration of a pump including a piezoelectric element.
Figure 2:
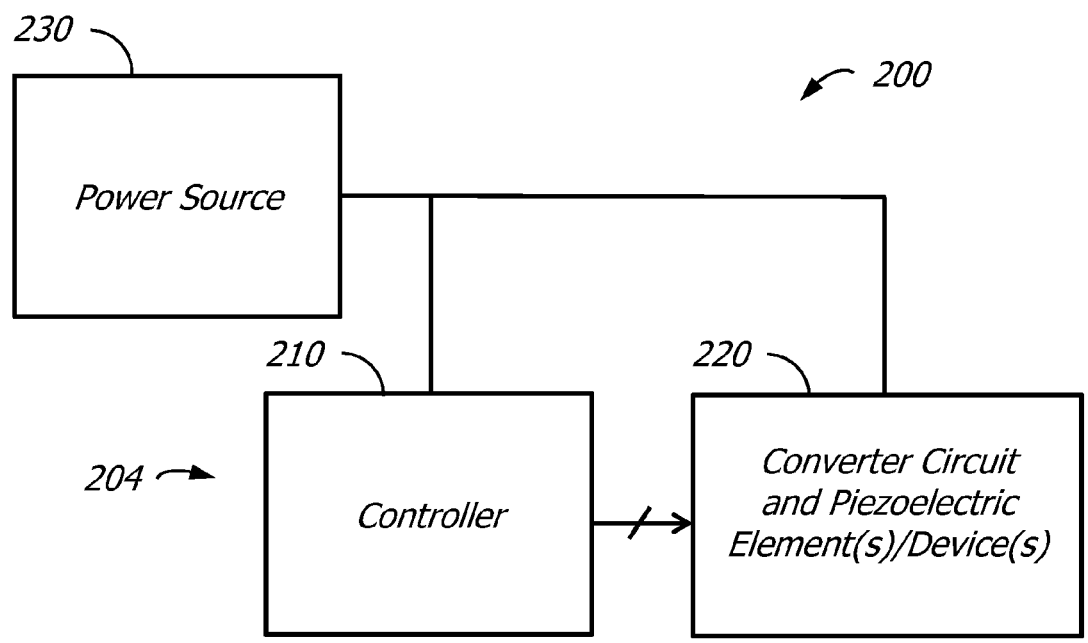
FIG. 2 is a diagram of a system including a drive circuit/electronics for producing a drive signal for a piezoelectric element or device.

Referring to FIG. 1, a pump 100 includes a pump body 102 (e.g., configured to at least partially define a pumping chamber) and a drive circuit 104. Referring to FIG. 2, in an example embodiment, a system 200 includes drive circuit/electronics 204 for producing a drive signal for a piezoelectric element or device, a controller 210 (e.g., implemented utilizing one or more microcontrollers), a converter circuit and piezoelectric element/device 220, and a power source 230 configured as shown.

Figure 3:
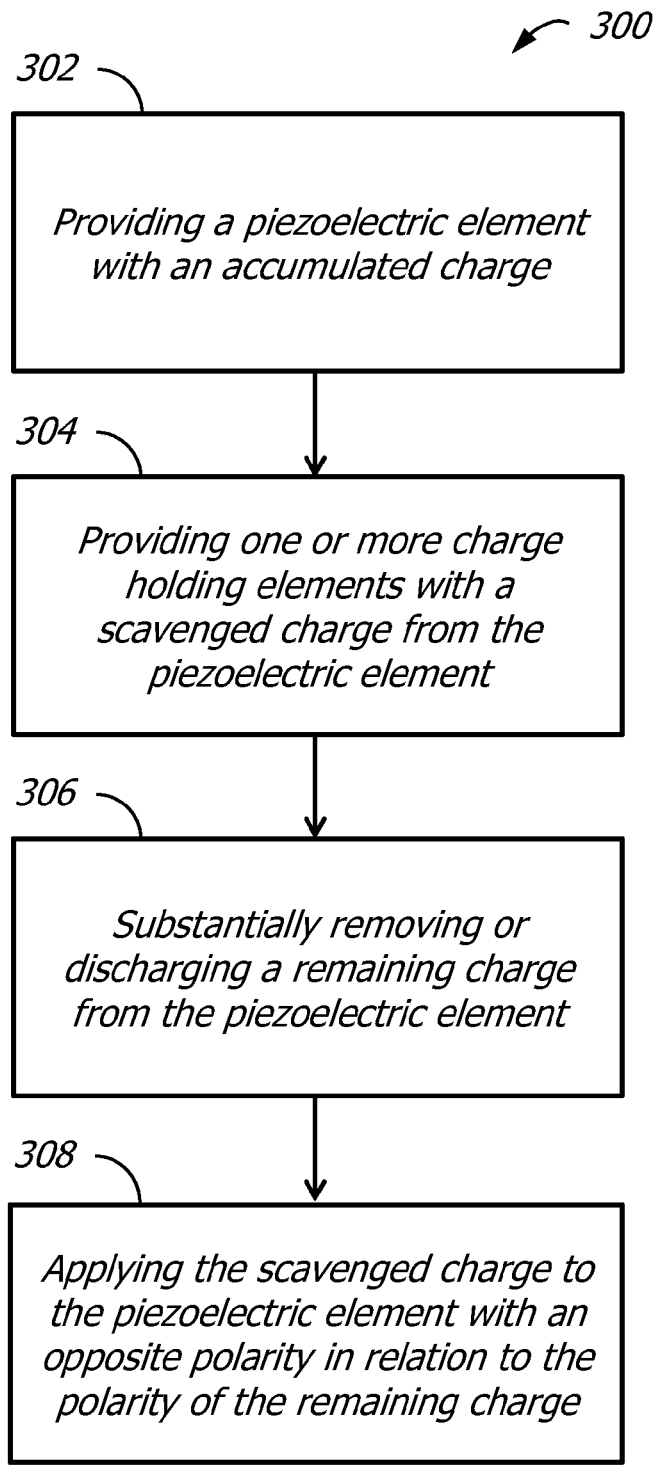
FIG. 3 is a flow diagram of an example method for applying charge to a piezoelectric element.

Referring to FIG. 3, in an example embodiment, a method 300 for applying charge to a piezoelectric element (or piezoelectric load) includes, at step 302, providing a piezoelectric element with an accumulated charge (e.g., utilizing pulses to provide a piezoelectric element with an accumulated charge and also a charge on one or more charge holding elements, such as a capacitor or a second piezoelectric element). For example, the accumulated charge is developed from (voltage) pulses (e.g., unipolar DC voltage pulses) provided by a voltage source (e.g., a DC voltage source or power supply, a fixed or regulated voltage or potential). At step 304, one or more charge holding elements are provided with a scavenged charge (scavenged or otherwise obtained) from the piezoelectric element. At step 306, a remaining charge (held by the piezoelectric element) is substantially removed or discharged from the piezoelectric element. For example, substantially removing or discharging a remaining charge includes coupling a voltage source to a terminal (e.g., the positive terminal) of the piezoelectric element. At step 308, the scavenged charge (held by the one or more charge holding elements) is applied to the piezoelectric element (e.g., with an opposite polarity in relation to the polarity of the remaining charge previously held by the piezoelectric element). For example, applying the scavenged charge includes decoupling (e.g., disconnecting) a terminal of the piezoelectric element (e.g., the negative terminal) from an electrical ground, and coupling the one or more charge holding elements to (said terminal of) the piezoelectric element.

Figure 4:
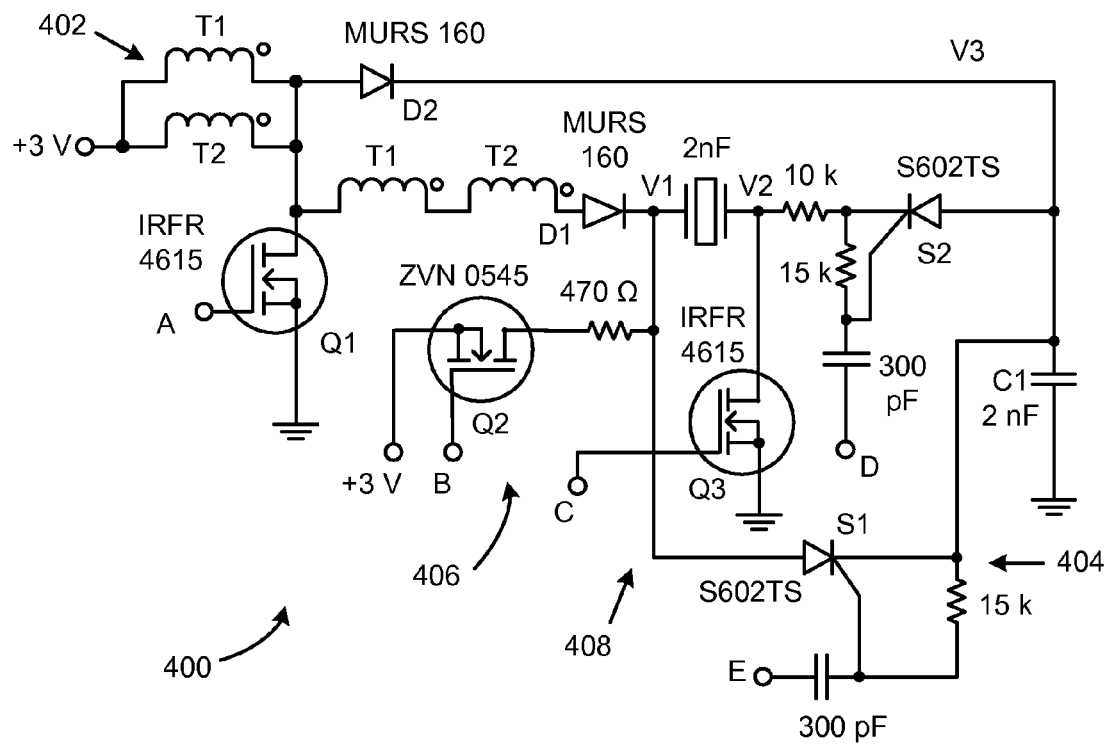
FIG. 4 is an electrical schematic showing an example embodiment of a piezoelectric driver circuit.

Referring to FIG. 4, in this example embodiment, a piezoelectric driver circuit 400 includes a flyback boost circuit 402 (Q1, T1, T2, D1, D2) configured to develop an accumulated charge (on or) associated with the piezoelectric element and also a charge on one or more charge holding elements (e.g., the flyback boost circuit including an inductor array configured such that different portions of the array are utilized for transferring charge to the piezoelectric element and C1, respectively). The capacitive element C1 can be provided, by way of example and not of limitation, as a discrete capacitor, a configuration of multiple (selectable) capacitive components, simulated capacitance(s), or a combination thereof. In example embodiments (involving a dual channel pump, for example), the one or more charge holding elements include a second piezoelectric element or transducer. The piezoelectric driver circuit 400 further includes a charge scavenging circuit 404 (S1—such as, for example, silicon-controlled rectifier S602TS) (e.g., connected between the piezoelectric element and the one or more charge holding elements) configured to provide a charge scavenged (or otherwise obtained) from the piezoelectric element to the one or more charge holding elements (e.g., C1 or a second piezoelectric element or transducer). In this example embodiment, the piezoelectric driver circuit 400 includes a charge removing circuit 406 (Q2—such as, for example, 100V plus N-channel MOSFET ZVN0545) (e.g., connected to the positive terminal of the piezoelectric element) configured to substantially remove or discharge a remaining charge from the piezoelectric element, and a charge reclaiming circuit 408 (Q3, S2—such as, for example, power MOSFET IRFR4615 and silicon-controlled rectifier S602TS, respectively) (e.g., connected to the piezoelectric element and the one or more charge holding elements) configured to apply the scavenged charge (held by the one or more charge holding elements) to the piezoelectric element (e.g., with an opposite polarity in relation to the polarity of the remaining charge previously held by the piezoelectric element).

In an example implementation, the piezoelectric driver circuit 400 is configured to drive a piezoelectric drug pump (e.g., to drive the piezoelectric element to +285 volts and then reverse polarity and drive the element to −75 volts), and the power supply is +3 volts.

The flyback boost converter 400 is formed with transistor Q1 (such as, for example, power MOSFET IRFR4615), coils T1 and T2 (such as, for example, dual winding inductors DRQ73-221) and diodes D1 and D2 (such as, for example, rectifier diodes MURS-160). Further switching and auxiliary capacitor, C1, are utilized to facilitate the scavenging of energy (from the piezoelectric element) and reversal of polarity at the piezo.

Figure 5:
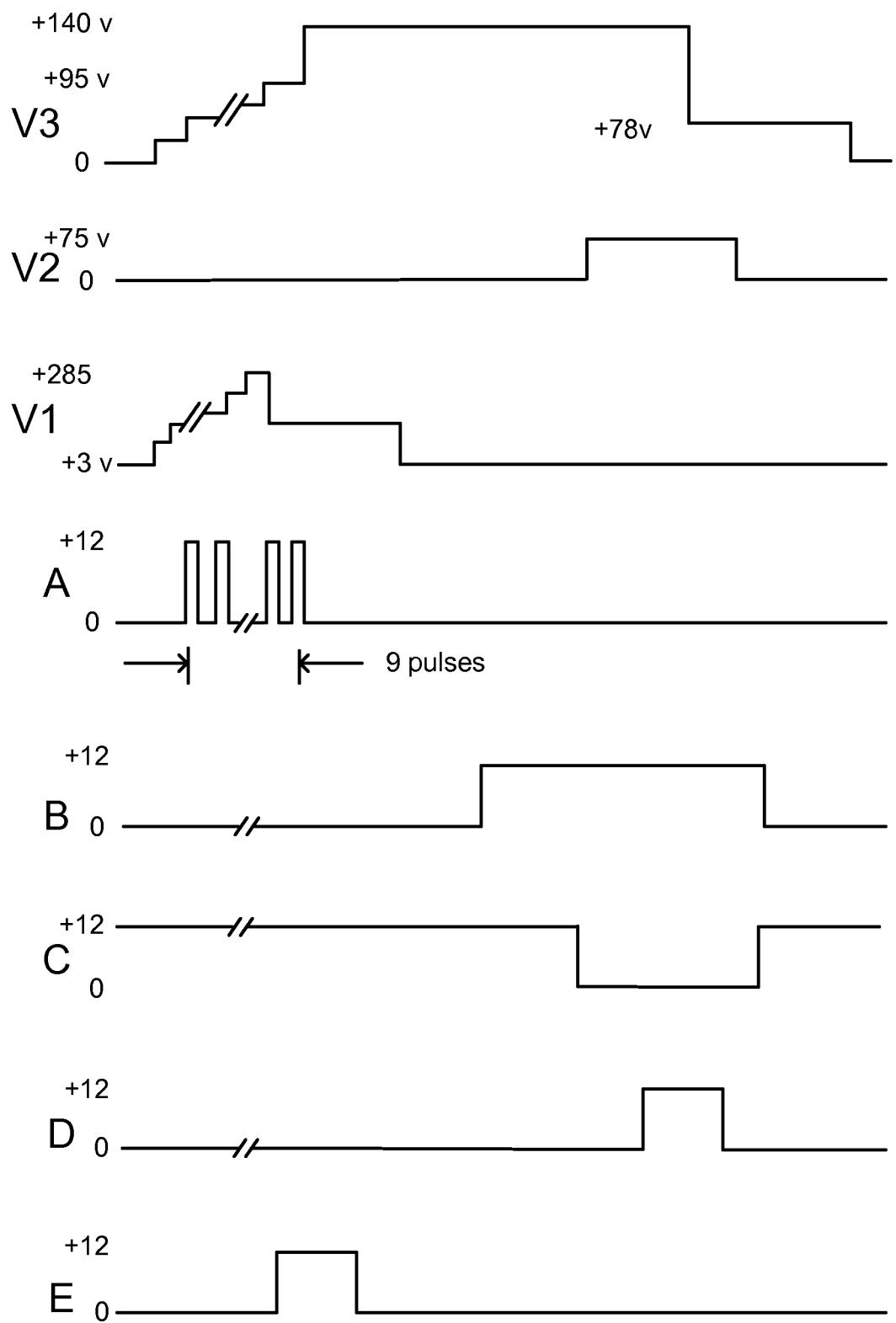
FIG. 5 is a plot showing voltage and control input levels during an example operation cycle implemented by the piezoelectric driver circuit of FIG. 4.
Figure 6:
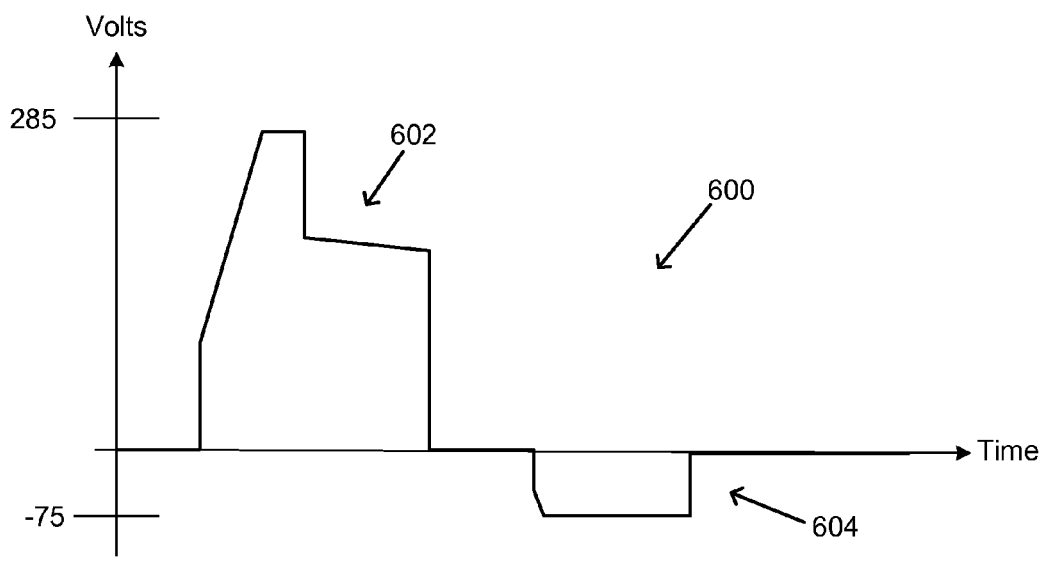
FIG. 6 shows a typical bipolar signal generated by the present invention for driving the piezoelectric element.
Figure 7:
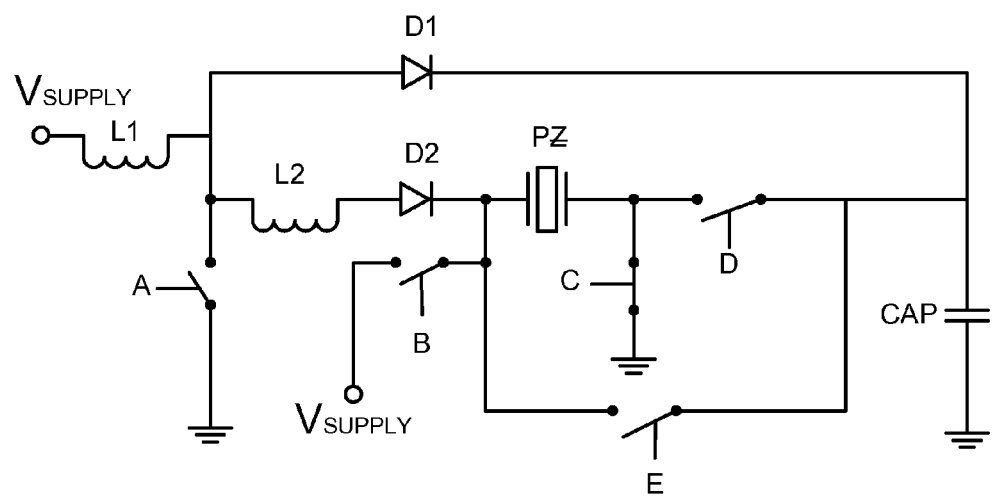
FIGS. 7-12 show a piezoelectric driver circuit at different stages respectively during an example implementation of a multi-stage process.
Figure 8:
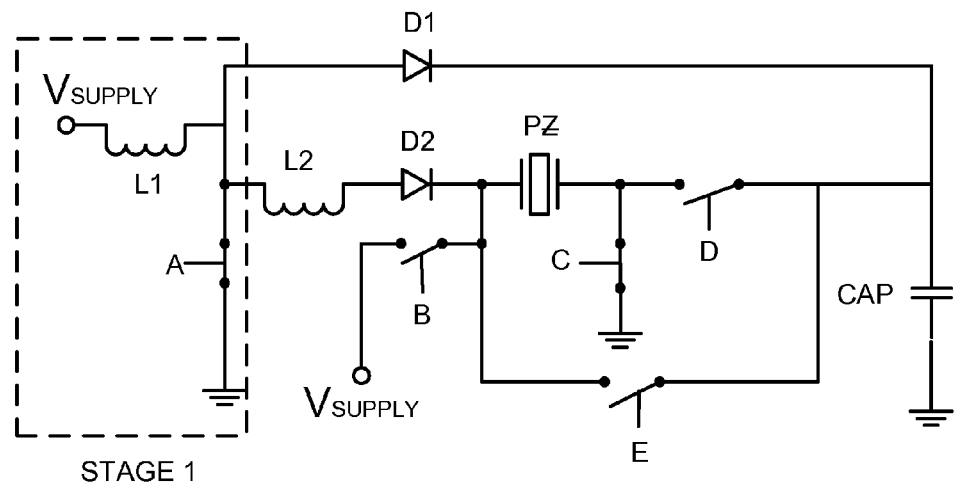
Figure 9:
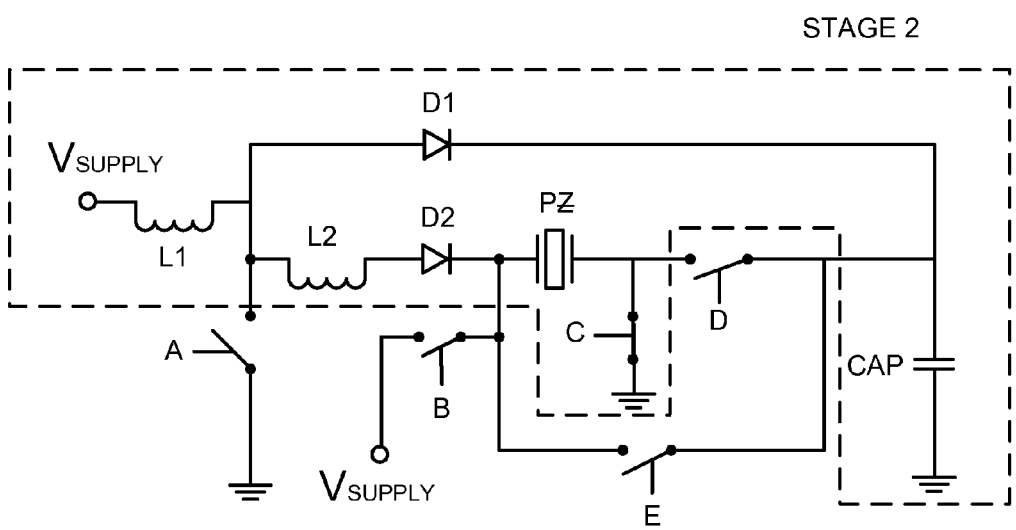
Figure 10:
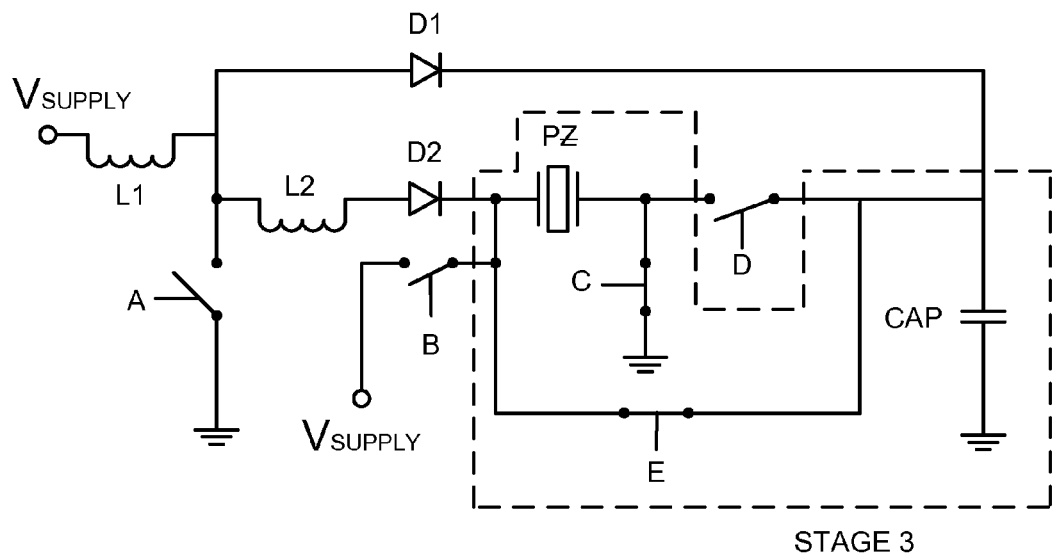
Figure 11:
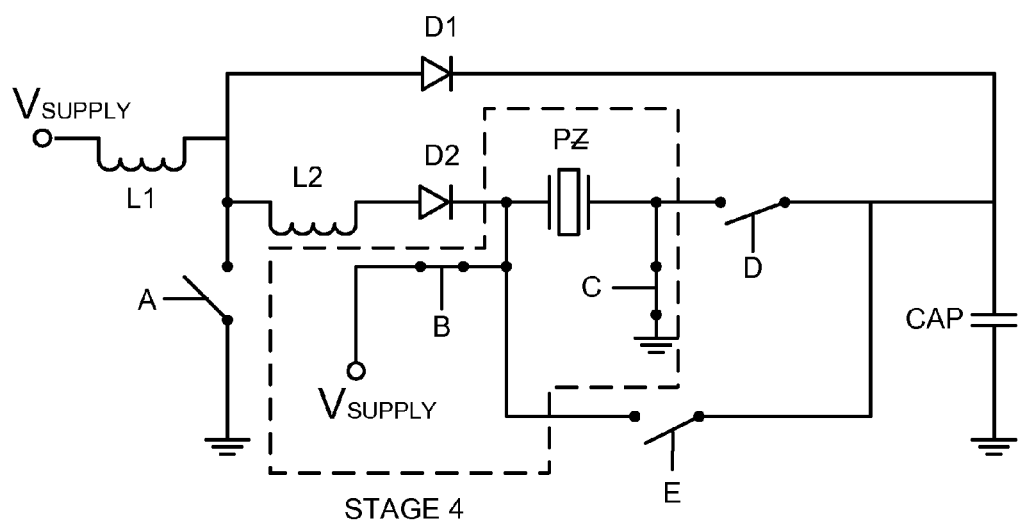
Figure 12:
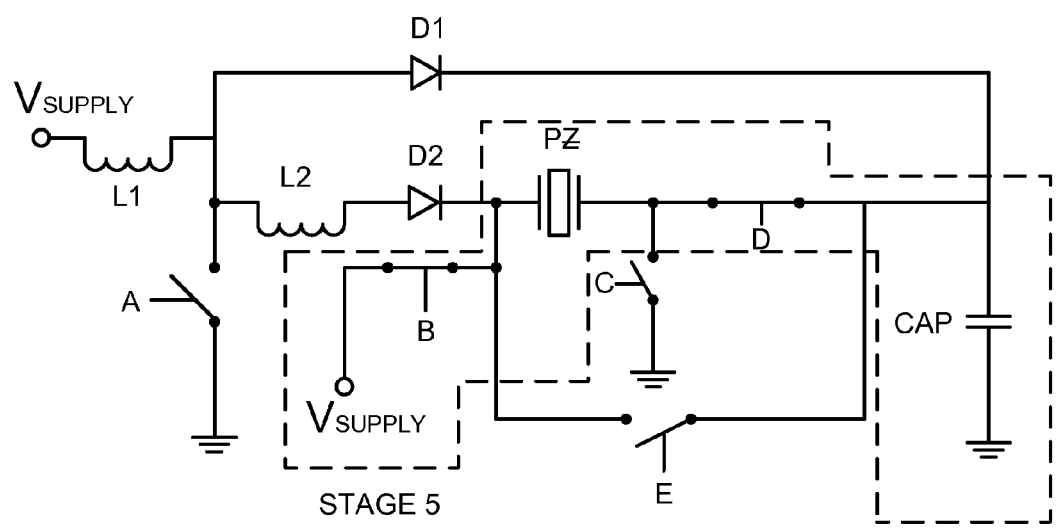

In an example implementation, coils T1 and T2 have two identical windings each, and a single coil exhibits 220 microhenries of inductance. In this circuit one winding from each coil is placed in parallel with a winding from the other coil. This parallel pair is driven by Q1 to store energy. The remaining two windings of the two coils are connected in series and attached to the paralleled pair so that the whole inductive array will exhibit three times the voltage seen across the paralleled pair. Referring additionally to FIGS. 5 and 6, when Q1 is pulsed by drive line A it applies the 3 volt supply across the paralleled pair of windings and current ramps up to 0.5 Amps. When line A drops Q1 turns off and the flyback effect forces current through diodes D1 and D2 to charge the piezo element and C1 simultaneously. The current through the coils provides the charge that is transferred to the piezo and C1. The high voltage flyback circuit provides the voltage sufficient to cause the charge transfer. While D1 is driven by the whole inductor array, D2 is only driven by the paralleled windings. As a consequence, and referring to FIG. 6 which shows a bipolar signal 600 transitioning from a positive signal 602 to a negative signal 604, after 9 pulses the piezo will have reached 285 volts and C1 will only have reached 95 volts. During this time transistor Q2 will be off and Q3 will be on to allow current through the piezo access to ground.

Once the piezo and the C1 are charged SCR S1 will be triggered by line E and charge from the piezo will be transferred to C1 raising it to +190 volts. Next Q2 is turned on to remove the remaining charge from the piezo. Q2 is connected to the +3 volt supply, otherwise supply current would flow through the coils, D1 and Q2 to ground. The next step is to turn Q3 off and trigger S2 using a pulse from line D. This will transfer charge from C1 to the opposite electrode of the piezo from the one which had previously held a positive charge. The resulting voltage should be +78 volts to produce a differential across the piezo of −75 volts referenced to the original charge of +285 volts. Finally transistor Q3 will be turned on to discharge the remaining charge on the piezo. Q2 will be turned off and the system will be ready for the next cycle.

Thus, in an example embodiment, a pump includes a pump body configured to at least partially define a pumping chamber, a piezoelectric element (e.g., a piezoelectric transducer or actuator situated in the pump body or external to the body) responsive to a drive signal for pumping fluid in the pumping chamber, and a pump driver configured to provide the drive signal (responsive to voltage pulses generated, for example, by a microcontroller). The pump driver includes a flyback boost circuit (Q1, T1, T2, D1, D2) configured to develop an accumulated charge (on or) associated with the piezoelectric element and also a charge on one or more charge holding elements (e.g., the flyback boost circuit including an inductor array configured such that different portions of the array are utilized for transferring charge to the piezoelectric element and C1, respectively), a charge scavenging circuit (S1) (e.g., connected between the piezoelectric element and the one or more charge holding elements) configured to provide a charge scavenged (or otherwise obtained) from the piezoelectric element to the one or more charge holding elements (e.g., C1), a charge removing circuit (Q2) (e.g., connected to the positive terminal of the piezoelectric element) configured to substantially remove or discharge a remaining charge from the piezoelectric element, and a charge reclaiming circuit (Q3, S2) (e.g., connected to the piezoelectric element and the one or more charge holding elements) configured to apply the scavenged charge (held by the one or more charge holding elements) to the piezoelectric element (e.g., with an opposite polarity in relation to the polarity of the remaining charge previously held by the piezoelectric element).

The pump driver is configured, for example, to provide the drive signal responsive to voltage pulses (e.g., unipolar DC voltage pulses). In example embodiments, the pump includes a controller (e.g., microcontroller) configured to generate the voltage pulses. The one or more charge holding elements include, for example, a capacitor or a second piezoelectric element. The flyback boost circuit includes, for example, an inductor array configured such that different portions of the array (or combinations thereof) are utilized for transferring charge to the piezoelectric element and a capacitor (e.g., C1), respectively. The flyback boost circuit includes, for example, an inductor array configured such that different portions of the array (or combinations thereof) are utilized for transferring charge to first and second piezoelectric elements, respectively. In example embodiments, the pump driver is configured to apply the scavenged charge to the piezoelectric element with an opposite polarity in relation to the polarity of the remaining charge (previously held by the piezoelectric element). In example embodiments, the pump driver is configured such that capacitances of the piezoelectric element and the one or more charge holding elements (e.g., C1) determine how much charge is reclaimed (e.g., both at 2 nF; more charge reclaimed if C1 is increased to, say, 20 nF while the capacitance of the piezoelectric element remains 2 nF). In example embodiments, the capacitance of a capacitor (e.g., C1) is at least as large as the capacitance of the piezoelectric element.

In example embodiments, the converter circuitry is configured to implement a multi-stage (e.g., two-stage) process utilizing the one or more charge holding elements (for example, different elements of a capacitive bank are utilized for different stages or portions of a multi-stage process).

FIGS. 7-12 show a piezoelectric driver circuit at different stages respectively during an example multi-stage process implemented as set forth below:

Pre/Post Fire

The Pre/Post Fire State is the idle state of the circuit. This is the circuit configuration that is used in between pump stroke events.

Stage 1

During Stage 1, switch A is closed, connecting the power supply to ground through the inductance L1. The current will develop to a desired level at which time the circuit moves to Stage 2.

Stage 2

When switch A is opened, the physics of the circuit creates a very high voltage at L1. This high voltage causes current to flow through L2/D2 and onto the piezo PZ as well as through D1 onto the capacitor CAP.

Cycle Stage 1 and Stage 2

Each time the circuit is cycled through Stage 1 and Stage 2, more and more charge accumulates on the piezo PZ and the capacitor. Once the desired voltage has been accumulated on the piezo PZ, the circuit moves to Stage 3.

Stage 3

The charge on the piezo PZ is available for scavenging in order to make the circuit more efficient. On Stage 3, the positive terminal of the piezo is connected to the positive terminal of the capacitor by closing switch E. Since the piezo is charged to a much higher voltage than the capacitor, charge will flow from the piezo to the capacitor until the charge on each component is equalized in proportion to their respective capacitances.

Stage 4

During Stage 4 the remaining charge on the positive terminal of the piezo is removed by closing switch B and thus connecting the positive terminal of the pieze to the positive supply. Note that the positive terminal of the piezo is not connected to ground in this circuit topology because doing so would create a path from the positive supply to ground through L1/L2/D2, wasting battery current. By connecting the piezo to the supply voltage instead, enough of the charge will be removed to make the circuit work, however the positive terminal of the piezo will not be at zero volts but rather at the supply voltage. Other or alternative circuit implementations (e.g., connecting the piezo to a different voltage or reference) can also be utilized.

Stage 5

In order to reverse the polarity on the piezo from the high positive voltage originally developed in Stage 2, the charge that was scavenged in Stage 3 is now applied to the opposite terminal of the piezo. Note that switch C is opened to disconnect the piezo terminal from ground and the terminal is connected to the capacitor by closing switch D. The piezo will be charged now in an opposite polarity from Stage 2 to a somewhat lesser voltage.

Stage 6

Return to the Pre/Post Fire stage.

Thus, in an example embodiment, a system including electronics for producing a drive signal (e.g., piezo driver) for a device (e.g., a drug pump) having (or operatively connected to) a piezoelectric transducer (e.g., a piezoelectric actuator forming a part of the electronics and serving to shape a waveform of the drive signal). The electronics include a controller (e.g., microcontroller) configured to generate voltage pulses and converter circuitry including one or more charge holding elements (e.g., C1). The converter circuitry is configured to use the voltage pulses to develop an accumulated charge (on or) associated with the piezoelectric transducer (and also a charge on one or more charge holding elements), provide the one or more charge holding elements (e.g., C1) with a scavenged charge (scavenged or otherwise obtained) from the piezoelectric transducer, substantially remove or discharge a remaining charge from the piezoelectric transducer, and apply the scavenged charge (held by the one or more charge holding elements) to the piezoelectric transducer (e.g., with an opposite polarity in relation to the polarity of the remaining charge previously held by the piezoelectric transducer).

In example embodiments, the controller is configured to operate without sensed or other feedback from the converter circuitry or the piezoelectric transducer. The converter circuitry can include a buck-boost circuit configured to accumulate charge developed from the voltage pulses (e.g., unipolar DC voltage pulses) via flyback, and the one or more charge holding elements can include a capacitor (e.g., C1) or a second piezoelectric transducer connected (or electrically coupled) to the buck-boost circuit.

In example embodiments, the converter circuitry is configured to develop the accumulated charge from (unipolar) DC voltage pulses (e.g., via flyback).

In example embodiments, the converter circuitry is configured to couple a voltage source (e.g., 3 VDC) to the piezoelectric transducer (and the one or more charge holding elements).

In example embodiments, the converter circuitry includes inductive elements (e.g., two or more of which are connect in series between the voltage source and the piezoelectric transducer). The inductive elements can be utilized to govern pulse width (of the voltage pulses). In example implementations, the inductive elements include matched inductive elements and/or are non-magnetic. In example implementations, the inductive elements include a paralleled pair and a series pair of inductive elements (e.g., configured in series with a diode (e.g., D1) between the voltage source and the positive terminal of the piezoelectric transducer.

With reference to FIGS. 7-12, the converter circuitry includes inductive elements (L1 and L2) connected in a series-aiding (boosting) configuration. The converter circuitry can include a first diode (D1) connected to the piezoelectric transducer and a second diode (D2) connected to the capacitor or a second piezoelectric transducer.

In example embodiments, the converter circuitry includes a charge scavenging circuit (S1) connected between the piezoelectric transducer and the one or more charge holding elements (e.g., configured to provide charge from the piezoelectric transducer to the one or more charge holding elements). In example embodiments, the converter circuitry includes a charge removing circuit (Q2) connected to the (positive terminal of the) piezoelectric transducer (e.g., configured to substantially remove or discharge a remaining charge from the piezoelectric transducer). In example embodiments, the converter circuitry includes a charge reclaiming circuit (Q3, S2) connected to the piezoelectric transducer and the one or more charge holding elements and configured to apply the scavenged charge to the piezoelectric transducer (e.g., with an opposite polarity in relation to the polarity of the remaining charge previously held by the piezoelectric transducer). In example embodiments, the converter circuitry is configured such that capacitances of the piezoelectric transducer and the one or more charge holding elements (e.g., C1) determine how much charge is reclaimed (e.g., both at 2 nF; more charge reclaimed if C1 is increased to, say, 20 nF while the capacitance of the piezoelectric transducer remains 2 nF). In example embodiments, the capacitance of a capacitor (e.g., C1) is at least as large as the capacitance of the piezoelectric transducer. In example embodiments, the converter circuitry is configured to implement a multi-stage (e.g., two-stage) process utilizing the one or more charge holding elements (for example, different elements of a capacitive bank are utilized for different stages or portions of a multi-stage process).

Thus, in an example embodiment, a method for applying charge to a piezoelectric element (or piezoelectric load) includes: imparting a scavenged charge to one or more charge holding elements (i.e., elements capable of holding an electric charge, such as a capacitive element), said scavenged charge being at least a portion of a charge (e.g., an accumulated charge) (on or) associated with a piezoelectric element (or piezoelectric load), and coupling a voltage source or reference (e.g., a DC voltage source or power supply, a voltage reference or level, fixed/regulated potential, or circuit ground) and the one or more charge holding elements to the piezoelectric element such that a (remaining) charge on the piezoelectric element is removed (or discharged) (or substantially removed/discharged) and the scavenged charge (held by the one or more charge holding elements) is applied to the piezoelectric element with an opposite polarity in relation to the polarity of the remaining charge (previously held by the piezoelectric element). The one or more charge holding elements include, for example, a capacitor or a second piezoelectric element.

In example embodiments, the method further includes utilizing a sequence of pulses to provide the accumulated charge (and also a charge on the one or more charge holding elements). In example embodiments, the method further includes utilizing additive electromotive forces to provide the accumulated charge (and also a charge on the one or more charge holding elements).

In example embodiments, the method further includes utilizing pulses (e.g., a sequence of pulses) to provide the accumulated charge and also a charge on the one or more charge holding elements. In example embodiments, the method further includes utilizing additive electromotive forces to provide the accumulated charge and also a charge on the one or more charge holding elements.

The accumulated charge is developed, for example, from voltage pulses (e.g., unipolar DC voltage pulses) via flyback. In example embodiments, the method further includes developing the accumulated charge from (unipolar) DC voltage pulses (e.g., via flyback). For example, developing the accumulated charge includes coupling (e.g., inductively coupling) the voltage source to the piezoelectric element (and the one or more charge holding elements).

In example embodiments, the method further includes utilizing an inductive coupling to provide the charge (and also a charge on the one or more charge holding elements). In example embodiments, coupling a voltage source (or reference voltage) (or circuit ground) and the one or more charge holding elements to the piezoelectric element includes one or more of, for example: providing charge from the piezoelectric element to the one or more charge holding elements, equalizing charge as between the piezoelectric element and the one or more charge holding elements (e.g., in proportion to their respective capacitances), coupling the voltage source to a terminal (e.g., the positive terminal) of the piezoelectric element to remove or dissipate charge accumulated or remaining on the piezoelectric element, and decoupling (e.g., disconnecting) a terminal of the piezoelectric element (e.g., the negative terminal) from an electrical ground, and coupling the one or more charge holding elements to (said terminal of) the piezoelectric element to apply the scavenged charge to the piezoelectric element.

Example implementations of the methodologies and technologies herein involve various design requirements and assumptions, theories of operation, and testing and implementation particulars, such as, for example:

Design Requirements
  Bipolar High Voltage Flyback Circuit capable of +285 V and −75V
  Pump drive circuit capable of achieving 2 mJ/µL energy efficiency or better Design Assumptions:
  Positive voltage (+285V) precedes negative voltage (−75V)
  Voltage supply is a stable 3V
  Flyback clock sources derived from the CPU
  10V Supply required to drive the FETs
  Piezo Pump Load approximately 2 nF for benchtop emulation Theory of Operation (FIGS. 4 and 5)
  Stage 1: A flyback circuit driven by a clock makes/breaks an inductive circuit to generate high voltage pulses. The high voltage accumulates via a diode onto a storage capacitor until +285V is reached.

Stage 2: The +285V is applied to the piezo load. When the pulse is over, the charge is scavenged back to another storage capacitor resulting in a +70V charge.

Stage 3: A −70V pulse is applied to the piezo pump from the scavenged charge capacitor by applying it in inverse polarity.

Conclusion

The battery life curve is an important consideration to the design.

CPU control of flyback clocks and drive signals can determine pulse timing.

Although the present invention(s) has(have) been described in terms of the example embodiments above, numerous modifications and/or additions to the above-described embodiments would be readily apparent to one skilled in the art. It is intended that the scope of the present invention(s) extend to all such modifications and/or additions.

What is claimed is:

1. A method for applying charge to a piezoelectric element, the method comprising:
    imparting a scavenged charge to one or more charge holding elements, said scavenged charge being at least a portion of an accumulated charge associated with a piezoelectric element; and
    coupling a voltage source or reference and the one or more charge holding elements to the piezoelectric element such that a remaining charge on the piezoelectric element is removed and the scavenged charge is applied to the piezoelectric element with an opposite polarity in relation to the polarity of the remaining charge.

2. The method of claim 1, wherein the one or more charge holding elements include a capacitor or a second piezoelectric element.

3. The method of claim 1, further comprising:
    utilizing a sequence of pulses to provide the accumulated charge.

4. The method of claim 1, further comprising:
    utilizing additive electromotive forces to provide the accumulated charge.

5. The method of claim 1, further comprising:
    utilizing pulses to provide the accumulated charge and also a charge on the one or more charge holding elements.

6. The method of claim 1, further comprising:
    utilizing additive electromotive forces to provide the accumulated charge and also a charge on the one or more charge holding elements.

7. The method of claim 1, wherein the accumulated charge is developed from voltage pulses via the flyback effect.

8. The method of claim 1, further comprising:
    developing the accumulated charge from DC voltage pulses.

9. The method of claim 8, wherein developing the accumulated charge includes coupling the voltage source to the piezoelectric element.

10. The method of claim 1, further comprising:
    utilizing an inductive coupling to provide the accumulated charge.

11. The method of claim 1, wherein imparting a scavenged charge includes providing charge from the piezoelectric element to the one or more charge holding elements.

12. The method of claim 1, wherein imparting a scavenged charge includes equalizing the voltage across the piezoelectric element and the one or more charge holding elements.

13. The method of claim 1, wherein coupling a voltage source and the one or more charge holding elements to the piezoelectric element includes coupling the voltage source to a terminal of the piezoelectric element to remove or dissipate charge accumulated or remaining on the piezoelectric element.

14. The method of claim 1, wherein coupling a voltage source and the one or more charge holding elements to the piezoelectric element includes decoupling a terminal of the piezoelectric element from an electrical ground, and
    coupling the one or more charge holding elements to the piezoelectric element to apply the scavenged charge to the piezoelectric element.

15. A method for applying charge to a piezoelectric element, the method comprising:
    providing a piezoelectric element with an accumulated charge;
    providing one or more charge holding elements with a scavenged charge from the piezoelectric element;
    substantially removing or discharging a remaining charge from the piezoelectric element; and
    applying the scavenged charge to the piezoelectric element with an opposite polarity in relation to the polarity of the remaining charge.

16. The method of claim 15, wherein the one or more charge holding elements include a capacitor or a second piezoelectric element.

17. The method of claim 15, wherein the accumulated charge is developed from pulses provided by a voltage source.

18. The method of claim 17, wherein substantially removing or discharging a remaining charge includes coupling the voltage source to a terminal of the piezoelectric element.

19. The method of claim 15, wherein applying the scavenged charge includes decoupling a terminal of the piezoelectric element from an electrical ground, and coupling the one or more charge holding elements to the piezoelectric element.

* * * * *